United States Patent
Yan et al.

(10) Patent No.: US 11,974,512 B2
(45) Date of Patent: Apr. 30, 2024

(54) PREPARATION METHOD OF SILICON-BASED MOLECULAR BEAM HETEROEPITAXY MATERIAL, MEMRISTOR, AND USE THEREOF

(71) Applicant: Hebei University, Baoding (CN)

(72) Inventors: Xiaobing Yan, Baoding (CN); Haidong He, Baoding (CN); Zhen Zhao, Baoding (CN)

(73) Assignee: Hebei University, Baoding (CN)

( * ) Notice: Subject to any disclaimer, the term of this patent is extended or adjusted under 35 U.S.C. 154(b) by 2 days.

(21) Appl. No.: 17/676,098

(22) Filed: Feb. 18, 2022

(65) Prior Publication Data

US 2023/0081176 A1 Mar. 16, 2023

(30) Foreign Application Priority Data

Sep. 14, 2021 (CN) .......................... 202111074604.7

(51) Int. Cl.
*C23C 14/08* (2006.01)
*H10N 70/00* (2023.01)

(52) U.S. Cl.
CPC ....... *H10N 70/8836* (2023.02); *C23C 14/088* (2013.01); *H10N 70/026* (2023.02)

(58) Field of Classification Search
CPC . C23C 14/088; H10N 70/026; H10N 70/8836
See application file for complete search history.

(56) References Cited

U.S. PATENT DOCUMENTS 5,291,035 A * 3/1994 Wellstood .......... H10N 60/0296
505/190
2003/0006406 A1* 1/2003 Chikyow .......... H01L 21/02491
257/E21.127

(Continued)

FOREIGN PATENT DOCUMENTS

CN 109913813 A * 6/2019

OTHER PUBLICATIONS

CN-109913813-A Translation (Year: 2019).*

(Continued)

*Primary Examiner* — Nicholas A Smith
*Assistant Examiner* — Patrick S Ott
(74) *Attorney, Agent, or Firm* — Bayramoglu Law Offices LLC

(57) ABSTRACT

A preparation method of a silicon-based molecular beam heteroepitaxy material, a memristor, and use thereof are provided. A structure of the heteroepitaxy material is obtained by allowing a $SrTiO_3$ layer, a $La_{0.67}Sr_{0.33}MnO_3$ layer, and a $(BaTiO_3)_{0.5}$—$(CeO_2)_{0.5}$ layer to successively grow on a P-type Si substrate. The silicon-based epitaxy structure is obtained by allowing a first layer of $SrTiO_3$, a second layer of $La_{0.67}Sr_{0.33}MnO_3$, and a third layer of $(BaTiO_3)_{0.5}$—$(CeO_2)_{0.5}$ (in which an atomic ratio of $BaTiO_3$ to $CeO_2$ is 0.5:0.5) to successively grow at a specific temperature and a specific oxygen pressure. The preparation method of a silicon-based molecular beam heteroepitaxy material adopts pulsed laser deposition (PLD), which is relatively simple and easy to control, and can achieve the memristor function and neuro-imitation characteristics. A thickness of the first buffer layer of $SrTiO_3$ can reach 40 nm.

6 Claims, 9 Drawing Sheets

(56) References Cited

U.S. PATENT DOCUMENTS

| | | | | |
|---|---|---|---|---|
| 2005/0276931 A1* | 12/2005 | Che | ............... | H01M 6/40 |
| | | | | 427/569 |
| 2007/0181421 A1* | 8/2007 | Wei | ............... | H01J 37/3408 |
| | | | | 204/298.02 |
| 2008/0153180 A1* | 6/2008 | Lansford | ............... | H01L 22/12 |
| | | | | 257/E21.528 |
| 2010/0075176 A1* | 3/2010 | Yamada | ............... | C23C 14/5806 |
| | | | | 359/359 |
| 2018/0223417 A1* | 8/2018 | Lu | ............... | C23C 14/35 |

OTHER PUBLICATIONS

Gomez, et al., Electric and Mechanical Switching of Ferroelectric and Resistive States in Semiconducting $BaTiO_3$-$\delta$ Films on Silicon, 2017, Advanced Science News (Year: 2017).*

Khatkhatay, et al., Ferroelectric Properties of Vertically Aligned Nanostructured $BaTiO_3$—$CeO_2$ Thin Films and Their Integration on Silicon, 2013, ACS Appl. Mater. Interfaces, 5, 12541-12547 (Year: 2013).*

Panchal, et al., The effect of oxygen stoichiometry at the interface of epitaxial $BaTiO_3/La_{0.7}Sr_{0.3}MnO_3$ bilayers on its electronic and magnetic properties, 2017, Journal of Applied Physics, 122 (Year: 2017).*

* cited by examiner

PREPARATION METHOD OF SILICON-BASED MOLECULAR BEAM HETEROEPITAXY MATERIAL, MEMRISTOR, AND USE THEREOF

CROSS REFERENCE TO THE RELATED APPLICATIONS

This application is based upon and claims priority to Chinese Patent Application No. 202111074604.7, filed on Sep. 14, 2021, the entire contents of which are incorporated herein by reference.

TECHNICAL FIELD

The present disclosure relates to the technical field of preparation methods of epitaxy materials, and in particular to a preparation method of a silicon-based molecular beam heteroepitaxy material, a memristor, and use thereof.

BACKGROUND

With the advent of the Information Age, the electronic information industry is rapidly developing, and electronic components such as capacitors, diodes, transistors, and complementary metal-oxide semiconductor (CMOS) transistors have become the basic pillars of the electronic information industry. The continuous development of human scientific research promotes the technological upgradation of electronic components, thereby greatly promoting the development of the electronic information industry and improving all aspects of people's lives.

Pulsed laser deposition (PLD), a new epitaxial growth process, shows different characteristics from previous preparation methods in scientific research and production, and has promising application prospects. Since the initial development of the epitaxial growth technique in the late 1950s and early 1960s, the epitaxial growth technique has become a new research focus in the fields of electronics and communications due to its excellent growth characteristics. The epitaxial growth technique shows wide application potential in the manufacture of high-frequency and high-power devices, the scientific research and exploration of new materials, and the like. In the field of scientific research and exploration of substrates, a new silicon-based molecular beam heteroepitaxy material preparation method can be studied and developed.

It is well known that epitaxial growth refers to the growth of a single crystal layer on a single crystal substrate (the single crystal layer meets specified requirements and has the same crystal phase as the substrate), as if the crystal extends out by a specified length. The quality of epitaxy may vary significantly with different epitaxy methods, and may change considerably with the change in the selected method and specific steps. Epitaxial materials are widely used in integrated circuits, PN junction isolation techniques, and large-scale integrated circuits because the epitaxial materials have a characteristic of improving the material quality. According to this characteristic, a silicon-based molecular beam heteroepitaxy material preparation method can be developed. PLD molecular beam epitaxy (MBE) technique is the latest crystal growth technique, where a substrate is placed inside an ultra-vacuum growth cavity, then a single crystal material to grow is placed on a target sleeve, and when the substrate is heated to a specified temperature, a gas is introduced to achieve a required pressure and a laser is turned on to enable the ejection of a molecular flow, such that a single crystal can grow. PLD involves simple operations and convenient preparation, and has bright prospects in future applications.

In the present disclosure, epitaxial samples that can grow repeatedly are prepared by adjusting preparation conditions such as temperature, oxygen pressure, laser mode, and laser frequency.

SUMMARY

The present disclosure is intended to provide a preparation method of a silicon-based molecular beam heteroepitaxy material, a memristor, and use thereof, which solves the problem that the existing method is difficult to control and can generally only produce one layer of epitaxial material.

In order to achieve the objective, the present disclosure adopts the following technical solutions: A preparation method of a silicon-based molecular beam heteroepitaxy material is provided, including the following steps:

a. fixing a cleaned Si substrate on a substrate platform in a cavity of a PLD device, and vacuum-pumping the cavity to $1 \times 10^{-4}$ Pa to $5 \times 10^{-4}$ Pa;

b. raising a temperature in the cavity to 90° C. to 110° C., and introducing Ar into the cavity to maintain a gas pressure in the cavity at 0.8 Pa to 1.2 Pa; turning on a laser to conduct pre-sputtering of a $SrTiO_3$ target for 1 min to 2 min and then conduct first formal sputtering of the $SrTiO_3$ target to form a $SrTiO_3$ film with a thickness of 4 nm to 8 nm; after the sputtering is completed, introducing $N_2$ into the cavity to maintain the pressure in the cavity at 90 Pa to 110 Pa; further raising the temperature in the cavity to 550° C. to 650° C., and pumping out the gas from the cavity to $1 \times 10^{-4}$ Pa to $5 \times 10^{-4}$ Pa; introducing $O_2$ into the cavity, and adjusting an interface valve to maintain the pressure in the cavity at 0.8 Pa to 1.2 Pa; and raising the temperature in the cavity to 680° C. to 720° C., turning on a laser to conduct the pre-sputtering of a $SrTiO_3$ target for 1 min to 2 min;

c. raising the temperature in the cavity to 740° C. to 760° C., and conducting a second formal sputtering of the $SrTiO_3$ target for 10 min to 20 min to form a first layer of $SrTiO_3$ on the Si substrate;

d. adjusting the $O_2$ pressure to 20 Pa to 30 Pa, and conducting the pre-sputtering of a $La_{0.67}Sr_{0.33}MnO_3$ target for 1 min to 2 min and then the formal sputtering of the target for 20 min to 40 min to form a second layer of $La_{0.67}Sr_{0.33}MnO_3$ on the first layer of $SrTiO_3$;

e. adjusting the $O_2$ pressure to 0.8 Pa to 1.2 Pa, and conducting the pre-sputtering of a $BTO-CeO_2$ target for 1 min to 2 min and then the formal sputtering of the target for 10 min to 20 min to form a third layer of $BTO-CeO_2$ on the second layer of $La_{0.67}Sr_{0.33}MnO_3$; and f. adjusting the $O_2$ pressure to $2 \times 10^4$ Pa to $5 \times 10^4$ Pa, annealing in-situ, and taking a product out after the product is cooled to room temperature.

In step a, the Si substrate may be subjected to ultrasonic cleaning successively in acetone and alcohol, $SiO_2$ removal with a diluted hydrofluoric (HF) acid solution, and ultrasonic cleaning in deionized water, and then taken out and blow-dried with $N_2$.

During the preparation, a temperature procedure may be set as follows:

step 1: raising from 0° C. to 100° C. in 5 min;
step 2: keeping at 100° C. for 3 min;
step 3: raising from 100° C. to 500° C. in 30 min;

step 4: raising from 500° C. to 750° C. in 25 min;
step 5: keeping at 750° C. for 90 min; and
step 6: decreasing from 750° C. to 0° C. in 150 min.

During the preparation, the laser may be set to be in an EGY NGR mode, the laser energy range may be set to 300 mj to 400 mj, a frequency of the pre-sputtering may be set to 1 Hz to 3 Hz, and a frequency of each formal sputtering may be set to 3 Hz to 7 Hz.

The first, second, and third layers may have thicknesses of 42 nm, 30 nm, and 40 nm, respectively.

Crystal phases of the first, second, and third layers may be (001)(002); (001)(002); and $(001)(002)_{BTO}$ and $(002)(004)_{CeO2}$, respectively.

An atomic ratio of $BaTiO_3$ to $CeO_2$ in the third layer may be 0.5:0.5.

A memristor is provided, wherein a structure of the memristor is obtained by allowing a Pd top electrode layer to grow on a silicon-based molecular beam heteroepitaxy material prepared by the method described above.

The Pd top electrode layer may have a thickness of 30 nm to 50 nm and a diameter of 80 μm to 100 μm.

Use of the memristor described above in neuro-imitation devices and ferroelectric devices is provided.

In the preparation method of the present disclosure, the design of a first buffer layer of $SrTiO_3$ on a silicon-based substrate is adjusted and the growth temperature, growth time, oxygen pressure, laser mode, and laser frequency of each layer are adjusted to achieve the growth of a heteroepitaxial material. A general epitaxy method can only provide one epitaxial material growing on a silicon-based substrate, and a buffer layer prepared by a general epitaxy method is only of a few nanometers and is very difficult to control. However, the method provided by the present disclosure can achieve the growth of three types of heterojunction materials, and the design of a buffer layer in the method is very ingenious, which can ensure that the three types of materials are all epitaxial, and results in reliable repeatability and easy preparation. In the present disclosure, P-type silicon is used as a substrate, and different growth conditions are provided to achieve the epitaxial growth of three types of heteroepitaxial materials, and X-ray diffractometry (XRD) and transmission electron microscopy (TEM) tests are conducted to prove that the method is stable and repeatable.

In the present disclosure, epitaxial samples that can grow repeatedly are prepared by adjusting preparation conditions such as temperature, oxygen pressure, laser mode, and laser frequency. In the present disclosure, with a Pd layer as a top electrode and an LSMO layer as a bottom electrode, the I-V and pulse electrical properties of a prepared sample are tested, which are manifested as memristor properties; and the synapse properties and ferroelectric properties are successfully imitated during a pulse modulation process. As we all know, a resistance of a memristor changes with a quantity of electricity flowing through the memristor, and a resistance change experienced by a memristor can be remembered by the memristor, which is very similar to the human brain. In the research of the present disclosure, different pulse parameters are applied to control a resistance of a memristor.

DETAILED DESCRIPTION OF THE EMBODIMENTS

The present disclosure will be further described below in conjunction with examples, but the following examples are only for illustration and do not limit the protection scope of the present disclosure in any way.

Example 1 Epitaxy Sample

Figure 1:
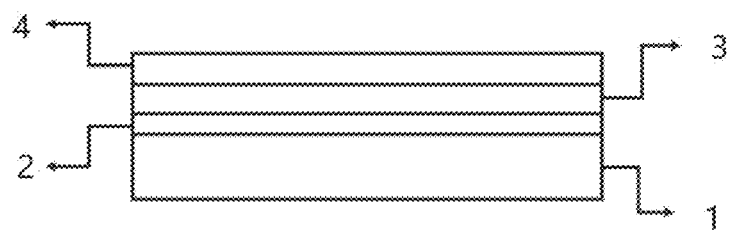
FIG. 1 is a schematic diagram of a structure of a sample prepared by the method of the present disclosure, where 1 represents a substrate, 2 represents a first epitaxial layer, 3 represents a second epitaxial layer, and 4 represents a third epitaxial layer.

As shown in FIG. 1, a structure of an epitaxy sample prepared by the method of the present disclosure includes a bottommost substrate 1, a first epitaxial layer 2 on the substrate 1, a second epitaxial layer 3 on the first epitaxial layer 2, and a third epitaxial layer 4 on the second epitaxial layer 3. The substrate 1 is a Si substrate, and the epitaxial layers are the first epitaxial layer $SrTiO_3$, the second epitaxial layer $La_{0.67}Sr_{0.33}MnO_3$, and the third epitaxial layer $(BaTiO_3)_{0.5}$—$(CeO_2)_{0.5}$ from bottom to top.

Example 2 Silicon-Based Molecular Beam Heteroepitaxy Method

The preparation method of the present disclosure included the following steps:

1. A Suitable Substrate was Prepared.

P-type Si was adopted as a substrate. The Si substrate was subjected to ultrasonic cleaning in acetone for 10 min and then in alcohol for 10 min, then soaked in a diluted HF acid solution for 90 seconds, taken out by wooden clips and subjected to ultrasonic cleaning in deionized water for 5 min, and finally taken out and blow-dried with $N_2$.

2. The Si Substrate was Placed in a Cavity of a PLD Device and the Cavity was Vacuum-Pumped.

Figure 2:
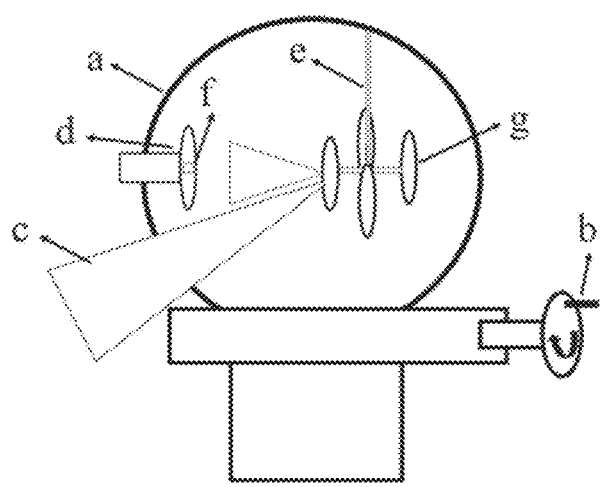
FIG. 2 is a schematic diagram of a structure of a PM sputtering device used in the preparation of the present disclosure, where (a) represents a cavity, (h) represents a gate valve, (c) represents a laser beam, (d) represents a substrate platform, (e) represents a target platform, (f) represents a tableting platform, and (g) represents a target.

As shown in FIG. 2, the cavity (a) of the PLD device was opened, and a tableting platform (f) was taken out, polished with sandpaper to remove surface stains, washed with acetone to remove waste resulting from the polishing and organic matters adhered on the surface, and finally wiped with alcohol. The cleaned substrate (namely, Si substrate)

was placed on the tableting platform (f) coated with silver glue (to enable uniform heat) for tableting, and during the tableting, the substrate was firmly pressed on the tableting platform (f) to ensure the uniform growth of a film during sputtering. The prepared tableting platform was placed and fixed on a substrate platform (d) in the cavity, and then the cavity (a) was closed and vacuum-pumped to $5\times10^{-4}$ Pa.

3. A Gas was Introduced.

There were four target platforms (e) located directly opposite to the tableting platform (f) (with a thermocouple wire for temperature control) in the cavity, and targets of the first, second, and third epitaxial layers were respectively placed on the target platforms (e) (with an empty one). A laser beam (c) outside the device was irradiated on the target platforms directly facing the tableting platform (f) through a glass window for initiation.

In this step, the thermocouple wire in the tableting platform (f) was heated first, then oxygen in the cavity (a) was pumped out by controlling a gate valve (b); a temperature in the cavity was raised to 100° C., and Ar was introduced to form a pressure of 1 Pa; then $SrTiO_3$ was sputtered for 1 min, and $N_2$ was introduced to maintain a pressure of 100 Pa; the temperature was raised to 600° C., and then the gas in the cavity was pumped out to maintain a pressure of $5\times10^{-4}$ Pa; $O_2$ was introduced into the cavity at a flow rate of 25 sccm, and the gate valve (b) was adjusted to maintain a pressure in the cavity at 1 Pa; a laser controller was set to be in an EGY NGR mode; and then the pre-sputtering of the $SrTiO_3$ target was conducted for 1 min to 2 min at a pulse frequency of 2 HZ, and the formal sputtering of the target was conducted at a pulse frequency of 5 HZ and a temperature of 700° C.

4. Epitaxy of a First Layer of $SrTiO_3$

After the pre-sputtering of $SrTiO_3$, the formal sputtering was conducted for 15 min, and a resulting sample stood for 10 min, such that the first layer of $SrTiO_3$ with a thickness of 42 nm was epitaxially formed on the Si substrate.

5. Epitaxy of a Second Layer of $La_{0.67}Sr_{0.33}MnO_3$

After the first layer of $SrTiO_3$ was formed, the gate valve (b) was adjusted to maintain the pressure in the cavity at 26 Pa, the pre-sputtering of $LaSrMnO_3$ was conducted for 1 min to 2 min, and then the formal sputtering of the target was conducted for 30 min; and a resulting sample stood for 10 min, such that a second layer of $La_{0.67}Sr_{0.33}MnO_3$ with a thickness of 30 nm was epitaxially formed on the first layer of $SrTiO_3$.

6. Epitaxy of a Third Layer of $(BaTiO_3)_{0.5}$—$(CeO_2)_{0.5}$

After the second layer of $La_{0.67}Sr_{0.33}MnO_3$ was formed, the gate valve (b) was adjusted to maintain the pressure in the cavity at 1 Pa, the pre-sputtering of $(BaTiO_3)_{0.5}$—$(CeO_2)_{0.5}$ was conducted for 1 min to 2 min, and then the formal sputtering of the target was conducted for 15 min; and a resulting sample stood for 10 min, such that a third layer of $BTO-CeO_2$ with a thickness of 40 nm was epitaxially formed on the second layer of $L_{0.67}Sr_{0.33}MnO_3$. Then the gate valve (b) was adjusted to maintain the pressure in the cavity at $3\times10^4$ Pa, and a resulting sample was annealed in-situ, and then taken out after being cooled to room temperature.

A Pd top electrode with a thickness of 40 nm and a diameter of 90 μm was allowed to grow on the sample in a magnetron sputtering device, and an LSMO layer was adopted as a bottom electrode, such as to determine the I-V and pulse electrical properties and ferroelectric properties.

Figure 3:
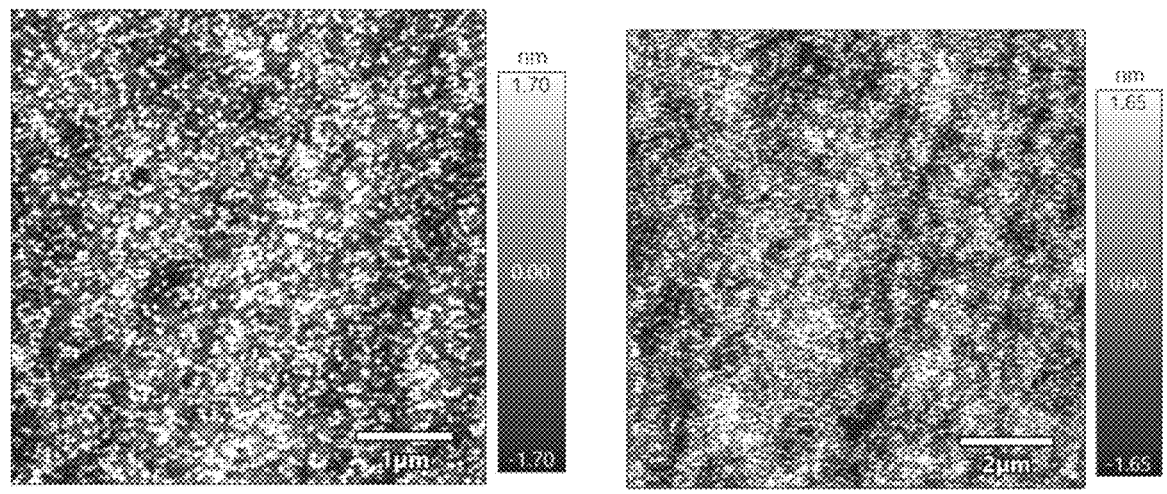
FIG. 3 is an atomic force microscopy (AFM) image of a sample obtained in Example 2.

FIG. 3 shows two randomly-selected AFM images with different sizes (5 μm and 10 μm), The scan results show that the sample prepared by this method has an extremely smooth surface, with a surface undulation only of 3.3 nm to 3.4 nm.

Figure 4:
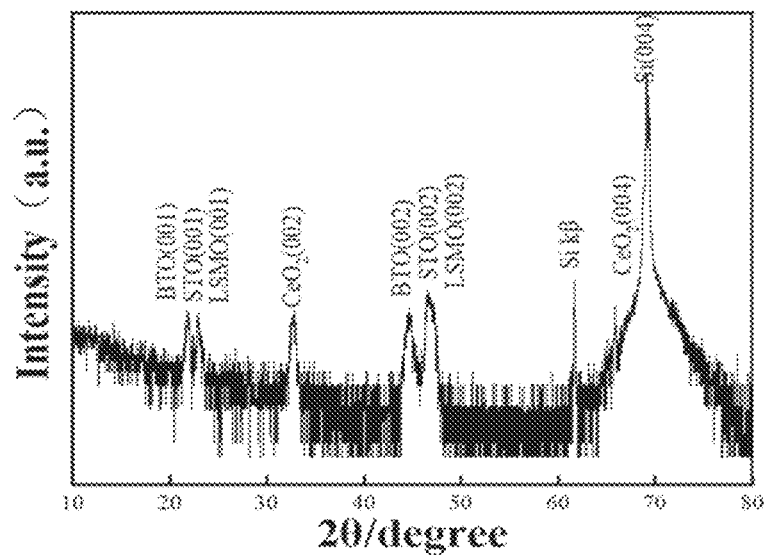
FIG. 4 is an XRD pattern of a sample obtained in Example 2.

FIG. 4 is an XRD pattern determined at a random position. The XRD pattern shows that the three layers growing exhibit particularly obvious diffraction, and the obtained crystal phase can further prove that the three layers prepared by this method are all formed through epitaxy.

Figure 5:
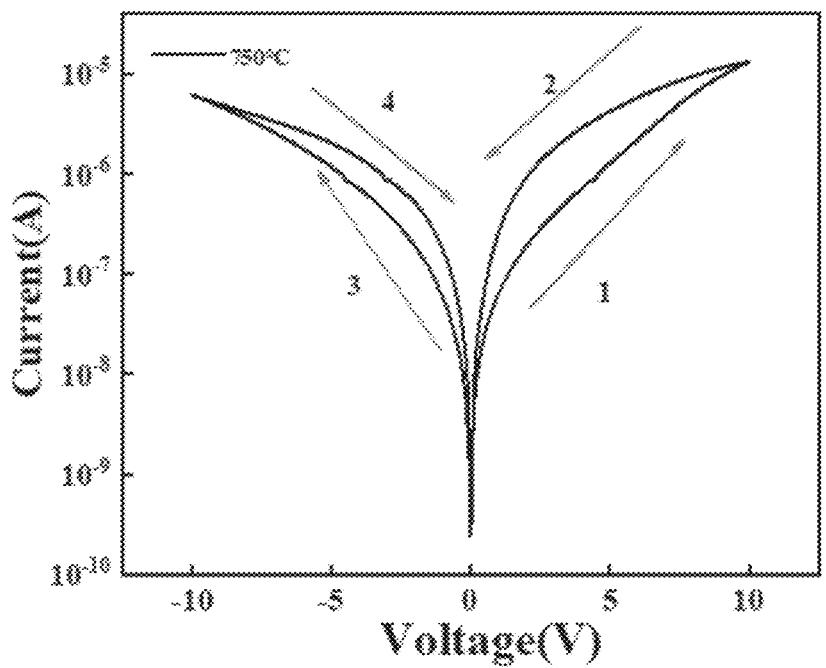
FIG. 5 shows a current change recorded by scanning the sample of Example 2 at a continuous voltage of −10 V to 10 V, which shows the memristor characteristics, wherein a resistance changes from high to low during a process of 0 V→+10 V→0 V (from 1 to 2) and a resistance changes from low to high during a process of 0 V→−10 V→0 V (from 3 to 4).

FIG. 5 shows an I-V curve of the top electrode sample prepared in Example 2. The top electrode is Pd formed through magnetron sputtering, and the bottom electrode is a second epitaxial layer of LSMO. It can he seen from the figure that the device also has obvious high and low resistance states, but the resistance changes slowly between the high resistance state and the low resistance state; that is, there are many obvious and definite resistance states between the high resistance state and the low resistance state, which is fully in line with the memristor characteristics in current scientific research.

Figure 6A:
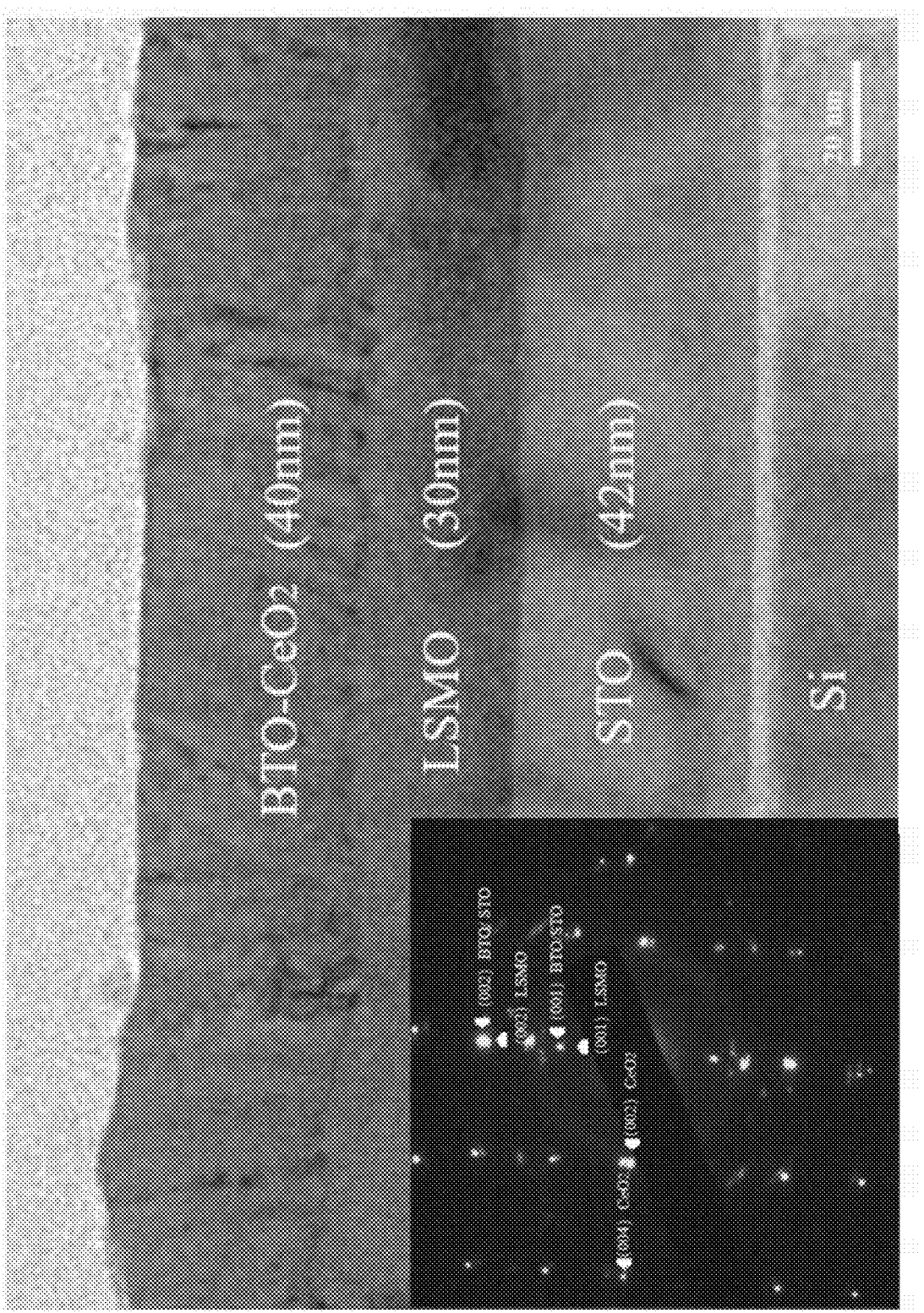
FIGS. 6A-6F show TEM images of the sample in Example 2.
Figure 6B:
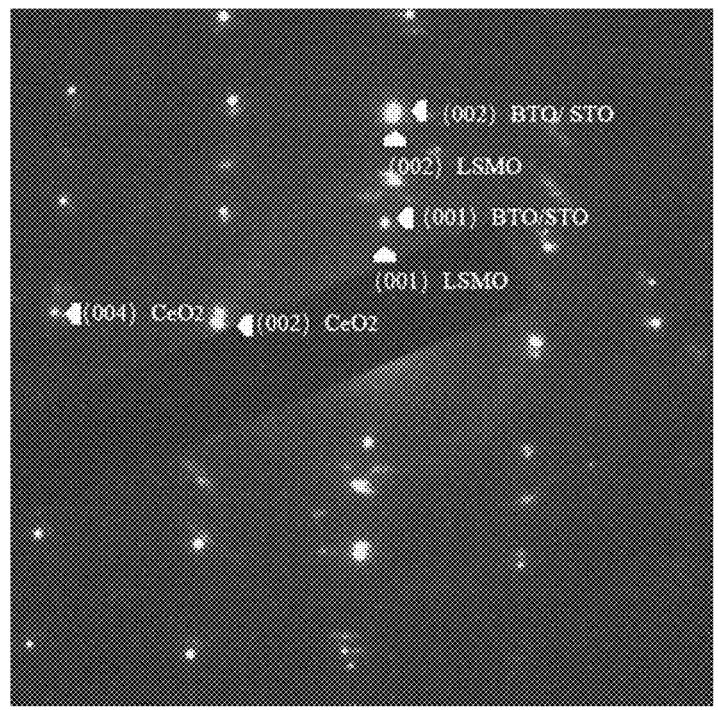
Figure 6C:
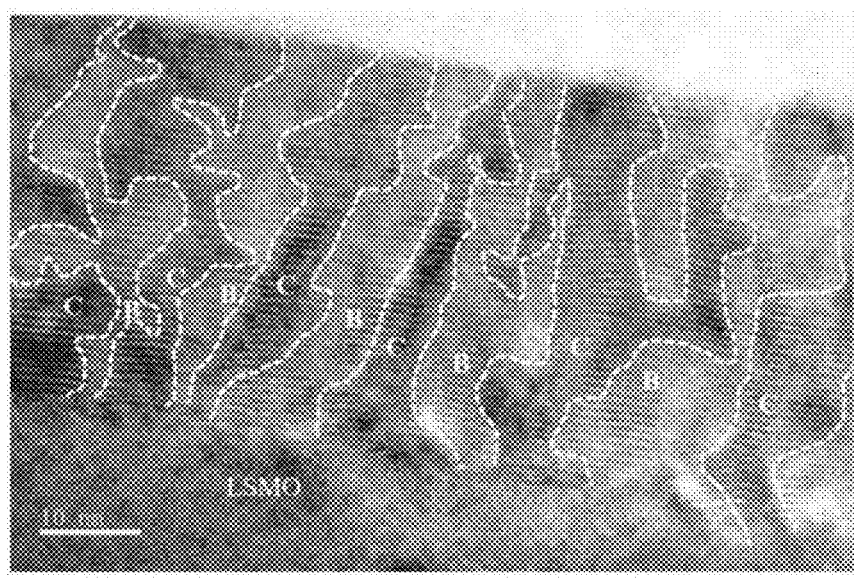
Figure 6D:
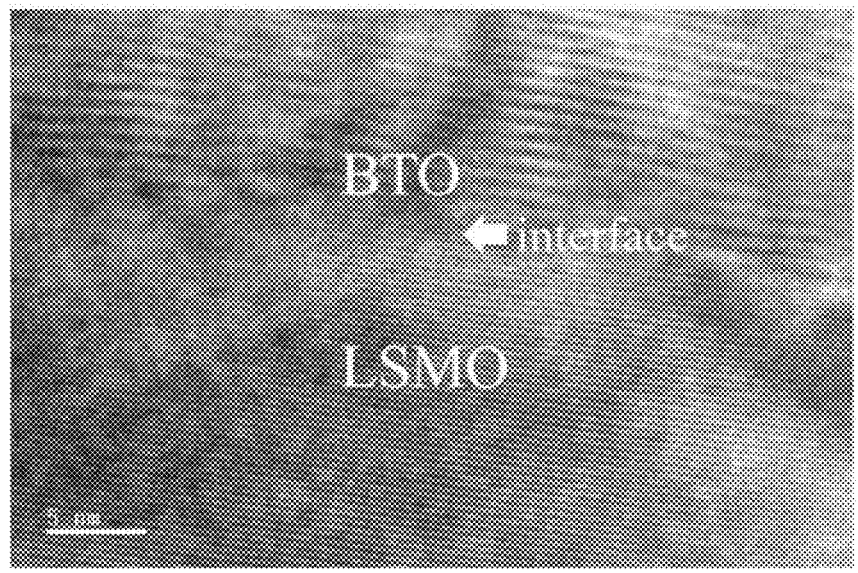
Figure 6E:
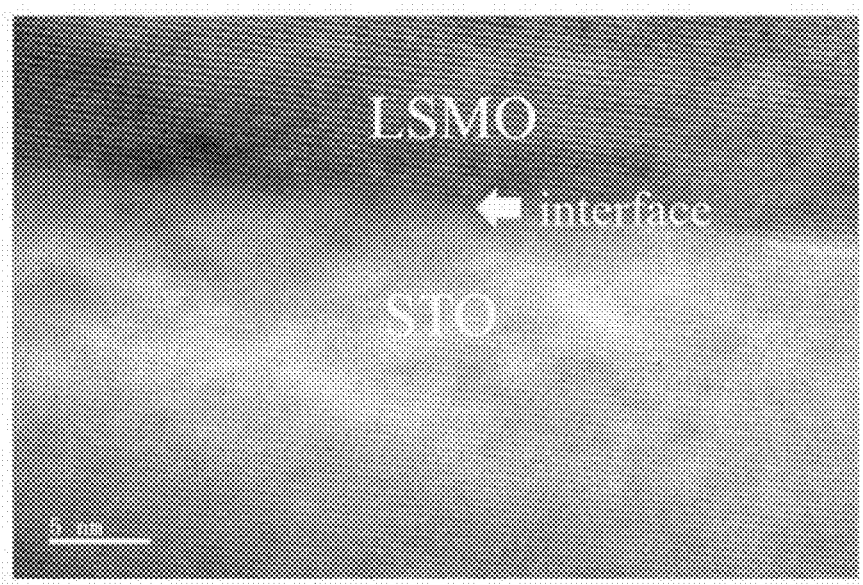
Figure 6F:
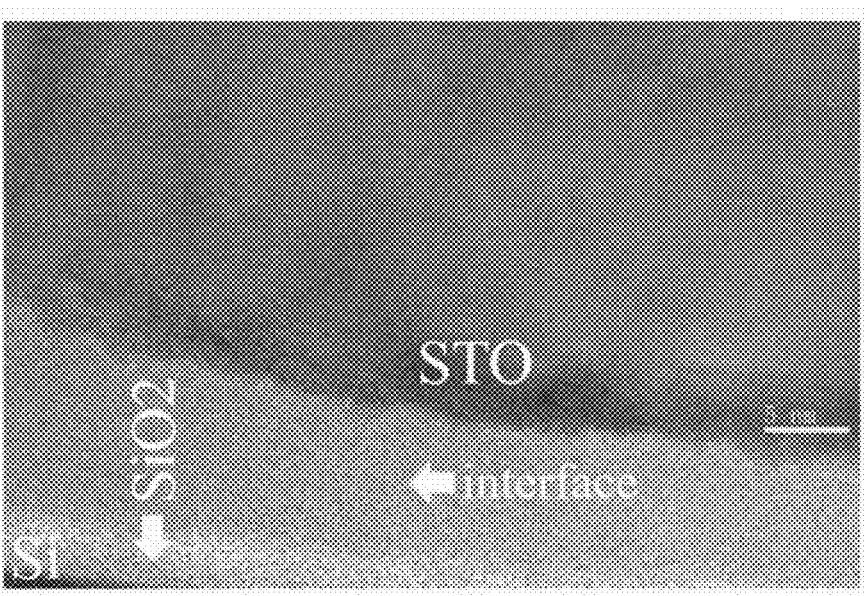

FIGS. 6A-6F show the TEM test results of the sample in Example 2, where FIG. 6A verifies that the obtained sample has a structure of $BaTiO_3$—$CeO_2/L_{0.67}Sr_{0.33}MnO_3/SrTiO_3/$Si from top to bottom; FIG. 6B shows the diffraction results, which verify the XRD test results of FIG. 4 and further prove that the sample prepared by this method is obtained through epitaxy; FIG. 6C to FIG. 6F show the crystallization and excessive heterojunction of the layers, respectively, where STO is a buffer layer, the initial growth presents an excessive state, and an epitaxy crystalline state is presented after a period time of growth, which verifies that the prepared sample is obtained through epitaxy.

Figure 7:
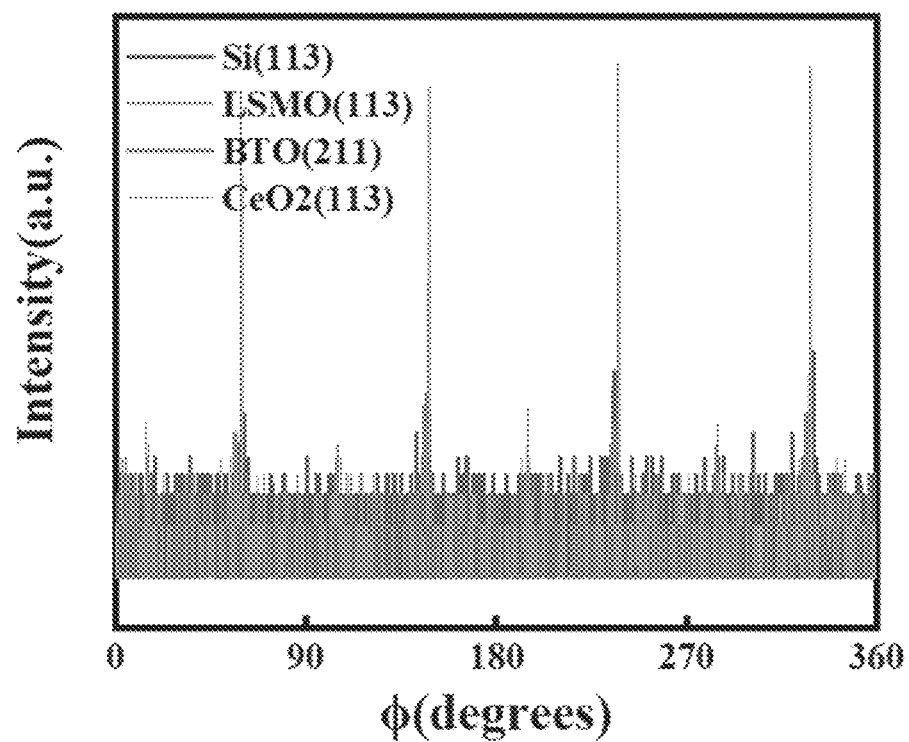
FIG. 7 shows a test result of the φ scan of epitaxial layers of the sample in Example 2.
Figure 8A:
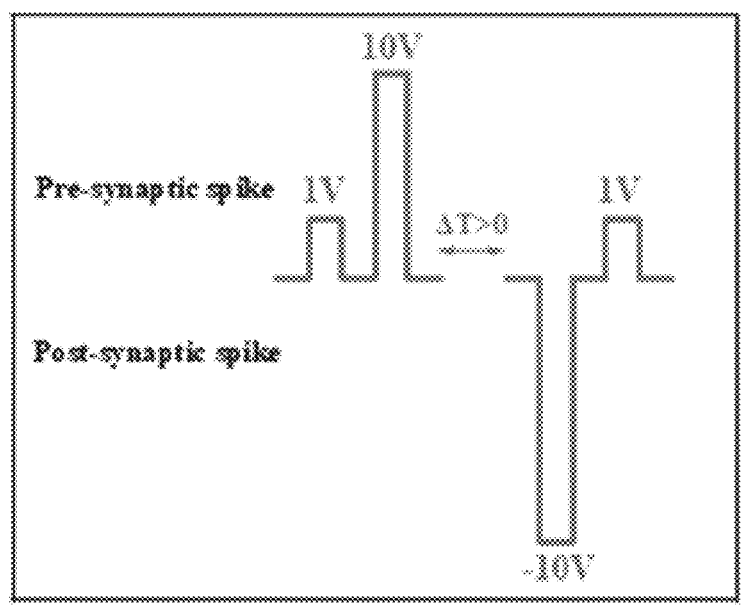
FIGS. 8A-8D show the neurological imitation of spiking-time-dependent plasticity (STDP) and paired-pulse facilitation (PPF) realized by modulating the resistance of the memristor.
Figure 8B:
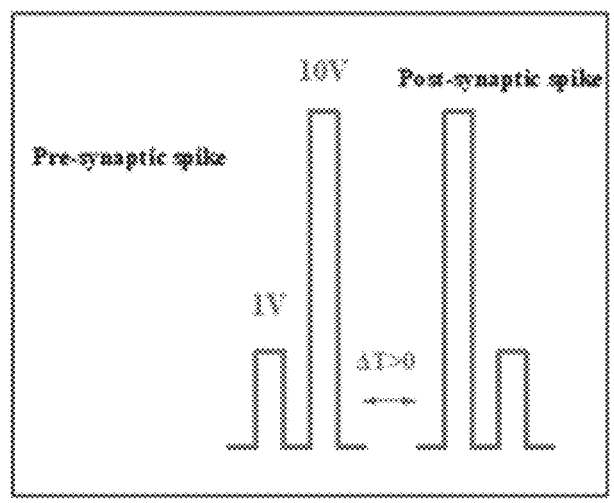
Figure 8C:
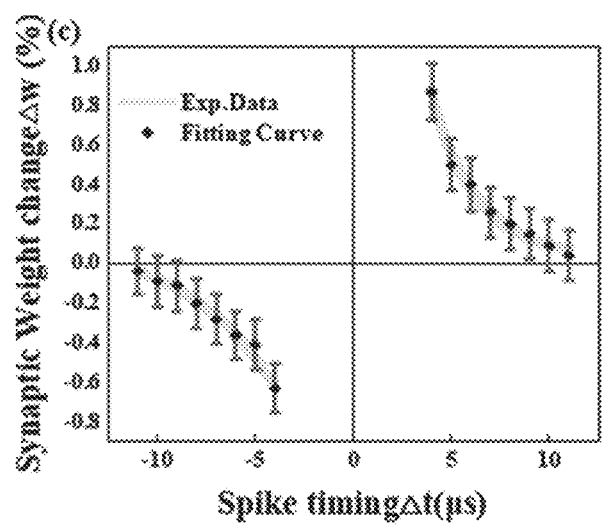
Figure 8D:
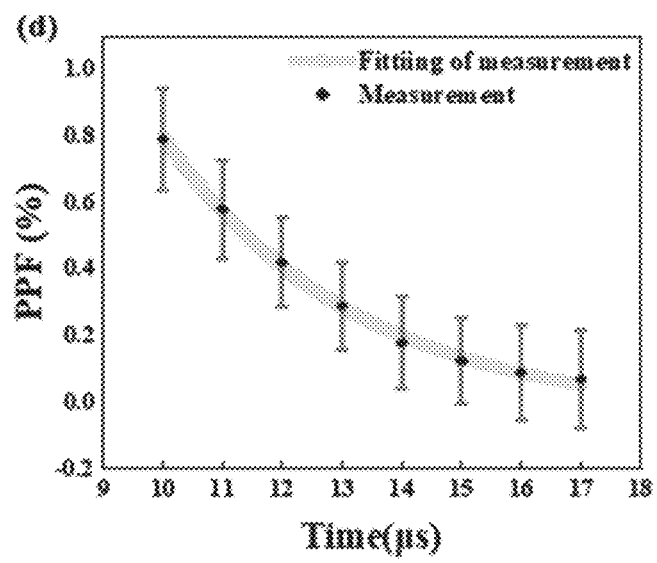

FIG. 7 shows the epitaxial φ scan test results of the epitaxial layers $CeO_2$ and LSMO, which further verify the epitaxy.

FIGS. 8A-8D show the neurological imitation of STDP and PPF realized by modulating the resistance of the memristor.

Figure 9:
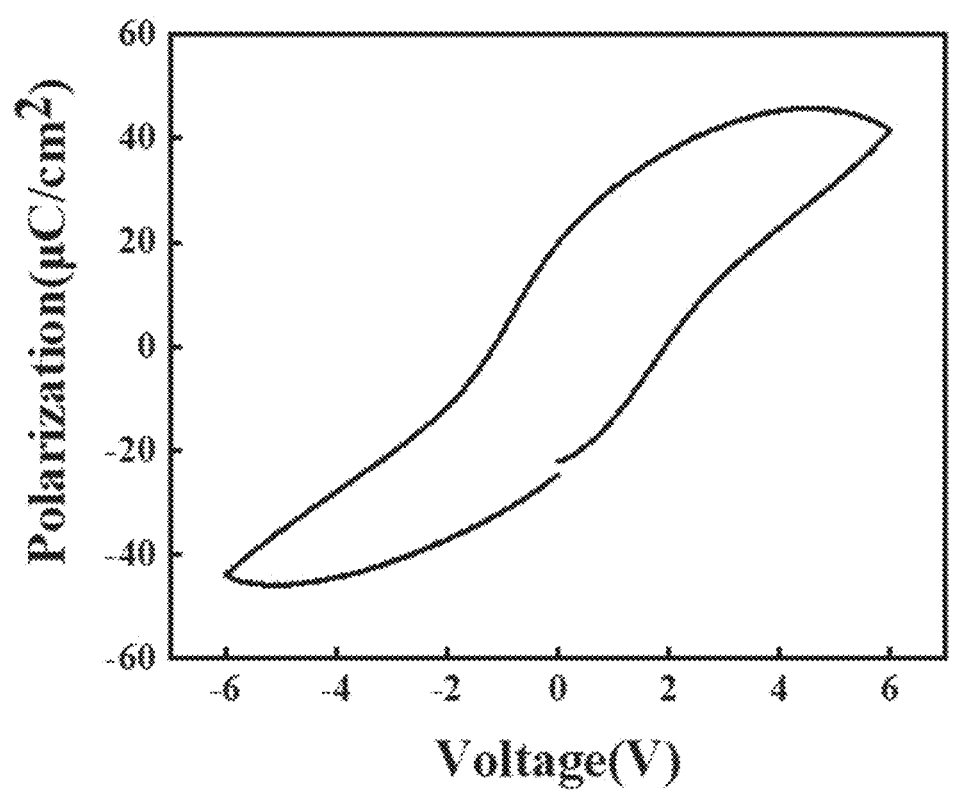
FIG. 9 shows a P-E ferroelectric test result.

FIG. 9 shows a P-E ferroelectric test result.

What is claimed is:

1. A preparation method of a silicon-based molecular beam heteroepitaxy material, comprising the following steps:
   (a) fixing a cleaned Si substrate on a substrate platform in a cavity of a pulsed laser deposition (PLD) device, and vacuum-pumping the cavity to $1\times10^{-4}$ Pa to $5\times10^{-4}$ Pa;
   (b) first raising a temperature in the cavity to 90° C. to 110° C., and then introducing Ar into the cavity to maintain a gas pressure in the cavity at 0.8 Pa to 1.2 Pa; then turning on a laser for 1 min to 2 min and then conducting a first formal sputtering of the $SrTiO_3$ target to form a $SrTiO_3$ film with a thickness of 4 nm to 8 nm; then after the first formal sputtering is completed, introducing $N_2$ into the cavity to maintain the gas pressure in the cavity at 90 Pa to 110 Pa; then further raising the temperature in the cavity to 550° C. to 650° C., and then pumping out gas from the cavity to $1\times10^{-4}$ Pa to $5\times10^{-4}$ Pa; then introducing $O_2$ into the cavity and then adjusting an interface valve to maintain the gas pressure in the cavity at 0.8 Pa to 1.2 Pa; and then raising the temperature in the cavity to 680° C. to 720° C., then turning on the laser for 1 min to 2 min;
   (c) raising the temperature in the cavity to 740° C. to 760° C., and conducting a second formal sputtering of the $SrTiO_3$ target for 10 min to 20 min, wherein the first and second formal sputtering of the $SrTiO_3$ target form a first layer of $SrTiO_3$ on the cleaned Si substrate;

(d) adjusting an $O_2$ pressure to 20 Pa to 30 Pa, and then conducting a first sputtering of a formal sputtering of a $La_{0.67}Sr_{0.33}MnO_3$ target for 20 min to 40 min, wherein the formal sputtering of the $La_{0.67}Sr_{0.33}MnO_3$ target forms a second layer of $La_{0.67}Sr_{0.33}MnO_3$ on the first layer of $SrTiO_3$;

(e) adjusting the $O_2$ pressure to 0.8 Pa to 1.2 Pa, and then conducting a formal sputtering of a $BTO$-$CeO_2$ target for 10 min to 20 min, wherein the first and second formal sputtering of the $BTO$-$CeO_2$ target forms a third layer of $BTO$-$CeO_2$ on the second layer of $La_{0.67}Sr_{0.33}MnO_3$;

(f) adjusting the $O_2$ pressure to $2\times10^4$ Pa to $5\times10^4$ Pa, then annealing in-situ thereby forming a product silicon-based molecular beam heteroepitaxy material defined by the first layer, second layer, and third layer, and taking the product silicon-based molecular beam heteroepitaxy material out of the cavity after the product silicon-based molecular beam heteroepitaxy material is cooled to room temperature.

2. The preparation method according to claim 1, wherein in step (a), a Si substrate is subjected to ultrasonic cleaning successively in acetone and alcohol, a diluted hydrofluoric (HF) acid solution is used to remove natural oxide layer $SiO_2$, and the Si substrate is subjected to ultrasonic cleaning in deionized water to obtain the cleaned Si substrate, and then the cleaned Si substrate is taken out and blow-dried with $N_2$ before fixing the cleaned Si substrate on the platform by thermally conductive silver adhesive.

3. The preparation method according to claim 1, wherein a frequency of each formal the second and fourth sputtering of the $SrTiO_3$ target, the formal sputtering of the $La_{0.67}Sr_{0.33}MnO_3$ target, and the formal sputtering of the $BTO$-$CeO_2$ target is set to 3 Hz to 7 Hz.

4. The preparation method according to claim 1, wherein the first, second, and third layers have thicknesses of 42 nm, 30 nm, and 40 nm, respectively.

5. The preparation method according to claim 1, wherein an atomic ratio of $BaTiO_3$ to $CeO_2$ in the third layer is 0.5:0.5.

6. The preparation method according to claim 1, wherein crystal phases of the first, second, and third layers are $(001)(002)_{STO}$; $(001)(002)_{LSMO}$; and $(001)(002)_{BTO}$ and $(002)(004)_{CeO_2}$, respectively.

* * * * *